(12) United States Patent
Araki et al.

(10) Patent No.: US 6,799,306 B2
(45) Date of Patent: Sep. 28, 2004

(54) SYSTEM FOR CHECKING WIRING CONFIGURATION OF PRINTED CIRCUIT BOARD

(75) Inventors: Kenji Araki, Saitamama (JP); Ayao Yokoyama, Nagano (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/872,955

(22) Filed: Jun. 1, 2001

(65) Prior Publication Data

US 2002/0019970 A1 Feb. 14, 2002

(30) Foreign Application Priority Data

Jun. 2, 2000 (JP) ..................................... P2000-166401
Aug. 7, 2000 (JP) ..................................... P2000-238188

(51) Int. Cl.⁷ .............................................. G06F 17/50
(52) U.S. Cl. ................................. 716/4; 716/5; 716/15
(58) Field of Search ........................ 716/1–21; 702/120; 703/1, 23; 714/733; 174/250, 261, 35 MS; 216/13; 257/697; 29/831; 307/91; 324/538; 333/1, 12, 33; 342/357.14; 345/87; 361/794; 439/101

(56) References Cited

U.S. PATENT DOCUMENTS

| 4,498,122 A | * | 2/1985 | Rainal ....................... 361/794 |
| 4,866,507 A | * | 9/1989 | Jacobs et al. ............... 174/258 |
| 5,363,550 A | * | 11/1994 | Aitken et al. ................. 29/828 |
| 5,493,076 A | * | 2/1996 | Levite et al. ............... 174/261 |
| 5,502,644 A | * | 3/1996 | Hamilton et al. .............. 716/5 |
| 5,986,893 A | * | 11/1999 | Leigh et al. ................. 361/777 |
| 6,058,256 A | * | 5/2000 | Mellen et al. ................ 716/12 |
| 6,420,778 B1 | * | 7/2002 | Sinyansky .................. 257/664 |
| 6,444,922 B1 | * | 9/2002 | Kwong ....................... 174/261 |
| 6,600,101 B2 | * | 7/2003 | Mazurkiewicz ........ 174/35 MS |
| 2001/0018761 A1 | * | 8/2001 | Sasaki et al. ................. 716/15 |
| 2003/0098177 A1 | * | 5/2003 | Cheng ........................ 174/261 |

* cited by examiner

Primary Examiner—Vuthe Siek
Assistant Examiner—Helen Rossoshek
(74) Attorney, Agent, or Firm—Robert J. Depke; Holland & Knight LLP

(57) ABSTRACT

Layout of a high-speed signal wiring on a power supply plane is checked and specified at an optimum position capable of minimizing a spurious electromagnetic radiation so as not to affect other wiring layers. When a high speed signal line which is an object to be checked exists on a power supply plane, a perpendicular distance between the high speed signal line and the plane which is nearest to the signal line is determined, and compared with a minimum required distance computed therefor in advance on the basis of its circuit specification of the high speed signal line. If the perpendicular distance determined does not exceed the minimum required distance computed, an appropriate message corresponding to the name of the high speed signal line is displayed.

8 Claims, 7 Drawing Sheets

SYSTEM FOR CHECKING WIRING CONFIGURATION OF PRINTED CIRCUIT BOARD

RELATED APPLICATION DATA

The present application claims priority to Japanese Application Nos. P2000-166401 filed Jun. 2, 2000, and P2000-238188 filed Aug. 7, 2000 which application are incorporated herein by reference to the extent permitted by law.

BACKGROUND OF THE INVENTION

The present invention relates to a system for checking a wiring configuration of a printed circuit board, and in particular, it relates to a system for checking a wiring configuration on a printed circuit board provided with a function to check an electromagnetic influence of a high speed signal line laid on a power supply plane to other signal line layers.

A conventional printed circuit board used in recent electronic device has lines for high speed signals (hereinafter, referred to as a high speed signal wiring) laid out on a power supply plane. If this high speed signal wiring is laid out in the vicinity of an edge of a ground-plane layer which functions as a reference as is normally done or in the vicinity of an edge of the power supply plane layer, there occurs such a problem that an electromagnetic field generated from the above-mentioned high speed signal wiring passes over the ground-plane layer functioning as a reference or the power supply plane layer, and reaches to other signal line layer or another ground (power supply) plane layer, thereby causing an electromagnetic coupling to occur.

The above-mentioned electromagnetic field generated from the high-speed signal wiring has sometimes caused a malfunction or spurious radiation noise depending on conditions of the use.

Further, the above-mentioned phenomenon may induce not only the electromagnetic coupling to the other wiring but also cause resonance phenomena with ground-plane layers or power supply plane layers.

However, in conventional low speed digital signal lines, because of a relatively moderate electromagnetic energy of the low speed digital signal, influences to other signal lines and/or spurious radiation thereof did not appear so significantly. Further, if its wiring density were not so great, any high speed signal wiring which is likely to cause the problem may easily be rearranged to be laid out far from the edge of the plane layer toward a center of the board, thereby preventing an occurrence of any adverse effect on other signal lines.

SUMMARY OF THE INVENTION

With a recent trend for a faster speed, a number of high speed signal lines is increasing, and also with an increasing demand for a light-weight, thinner, shorter and compacter design as well as a provision of multi-function, a wiring density within a printed circuit board is increasing more and more, thereby inevitably introducing such a condition (a condition to be described later in which "dist" in FIG. 1 must be shortened) that the high speed signal lines cannot be helped but to be laid out near to the edge portion of the board (nearer to the edges of the ground-plane layer or power supply plane layer). As a result, actually there are such cases in which their high speed signal lines must have been laid out toward the edges of the ground-plane layer (same as the board edge) or the power supply plane layer, thereby substantially increasing a radiation noise from the edge portion of the board.

Further, there has been such a problem associated with the conventional art that an appropriate position of lay-out of a certain high speed signal line causing a problem cannot be determined precisely how far from the edge portion and how near to the center of the board it should be laid out to solve the problem.

The present invention has been contemplated to solve the above-mentioned problem associated with the conventional design of the printed circuit board. An object of the present invention is to provide a system for checking wiring configuration of a printed circuit board. Another object of the present invention is to provide a system capable of specifying an appropriate position of wiring lay-out for high speed signals on a power supply plane. Here, the appropriate position of lay-out is such a position capable of alleviating adverse electromagnetic effect on other wiring layers.

In order to solve the above-mentioned problems, a wiring configuration check system for checking a configuration of a wiring which is tentatively designed and laid out on a printed circuit board is provided in accordance with one embodiment of the present invention. The system in accordance with the one embodiment of the present invention may comprise: an object determination unit for determining presence of a high speed signal wiring by extracting (sampling) a combination of a driver and a receiver one by one from a group of components existing on the above-mentioned wiring, extracting circuit information relating to a driver corresponding to one of the combination, and on the basis of a result of evaluation using a determination expression which contains at least a part of the circuit information as its variable; a segment extract (sample) unit for extracting a segment which is nearest to an edge of the board from a group of segments each defining a set of a minimum unit of configuration of the above-mentioned wiring; a plane edge specifying unit for specifying a plane edge which has a shortest perpendicular distance relative to the wiring connecting between a driver and a receiver in the segment by investigating its wiring configuration of the segment extracted above; a perpendicular distance measuring unit for measuring a perpendicular distance relative to the wiring extending from the driver to the receiver in the segment; an interlayer distance computing unit for computing a minimum interlayer distance required between the wiring layer of the segment and the plane layer, on the basis of a type of the wiring configuration and a circuit design specification of the segment extracted above; a distance determination unit for comparing the perpendicular distance measured above and the interlayer distance computed above; and a message display unit for displaying a message containing a predetermined instruction corresponding to the wiring based on a result of determination by the distance determination unit.

In accordance with another embodiment of the present invention, a wiring design support system is provided for supporting a design of a signal line wiring on a circuit board. The design support system of the another embodiment of the present invention may comprise: a confirmation unit for confirming a presence of a high speed signal line on a power supply plane; a unit for measuring a lay-out of a high speed signal line wiring if there exists the high speed signal line wiring, and which was tentatively designed on the power supply plane (namely, a perpendicular distance "dist" from the edge of the ground-plane layer or the power supply plane layer to the wiring), computing a minimum distance required (for the above-mentioned perpendicular distance of the lay-out of the high speed signal line wiring) using predetermined mathematical expressions, on the basis of the circuit design specification of the high speed signal line wiring, and comparing the perpendicular distance "dist" measured above with the minimum distance required therefor computed above; and a unit for displaying an appropriate message corresponding to a specified name of the signal wiring if the perpendicular distance "dist" measured above does not exceed the minimum distance required therefor computed above, thereby enabling a very efficient wiring design support task to be executed.

PREFERRED EMBODIMENTS OF THE INVENTION

Preferred embodiments of the present invention will now be described more specifically with reference to the accompanying drawings in the following.

Figure 1:
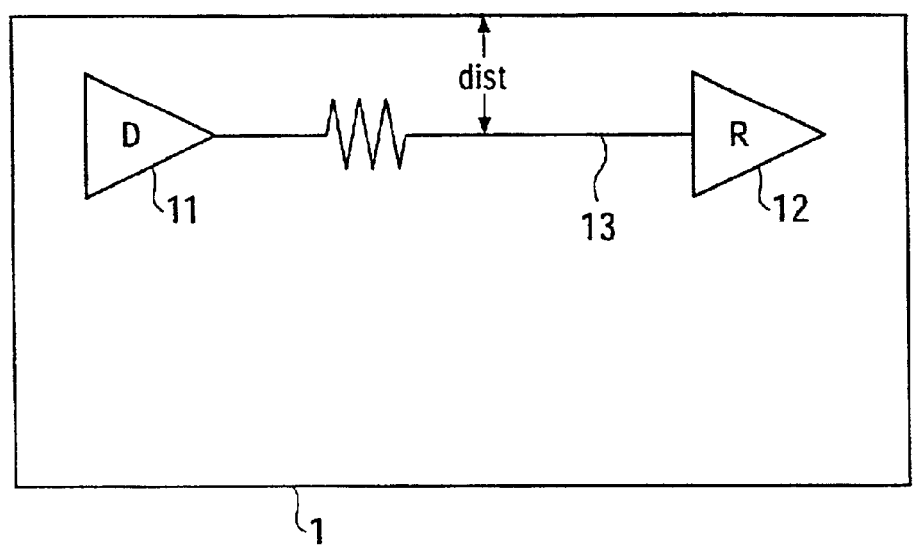
FIG. 1 is a schematic wiring diagram indicating a relationship between a ground (power supply) plane layer edge and a high speed signal line to be checked by a printed circuit board wiring configuration check system embodying the invention.

FIG. 1 is a wiring diagram indicating a relationship between the edge of a ground (power supply) plane layer and a high speed signal line on a wired board which is an object to be checked by a printed circuit board wiring configuration check system embodying the present invention.

The wiring diagram shown in FIG. 1 shows a power supply plane 1, and a driver 11, a receiver 12, and a high speed signal line 13 connecting the driver 11 and receiver 12. The driver 11, the receiver 12 and the high speed signal line 13 provided on the power supply plane 1.

Figure 2:
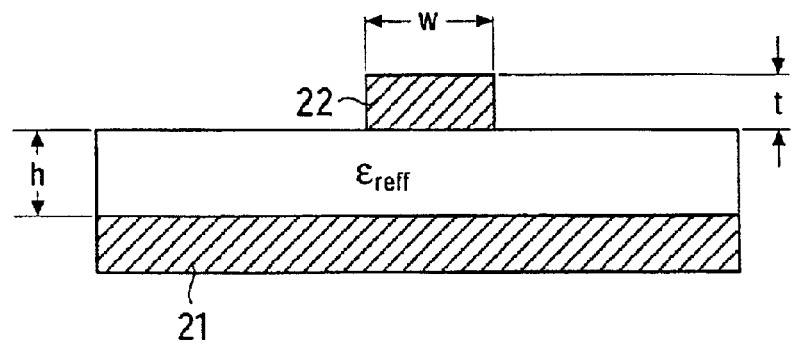
FIG. 2 is a diagram of a wiring configuration to be checked by the printed circuit board wiring configuration check system embodying the invention.
Figure 3:
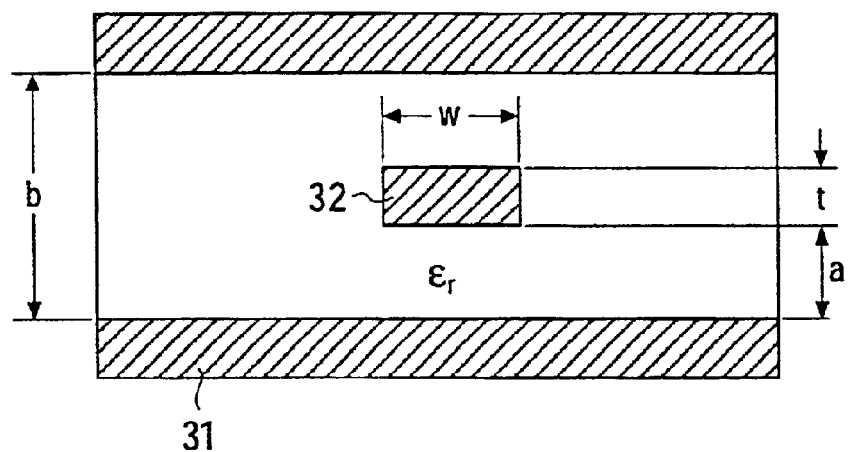
FIG. 3 is a diagram of another wiring configuration to be checked by the printed circuit board wiring configuration check system embodying the invention.
Figure 4:
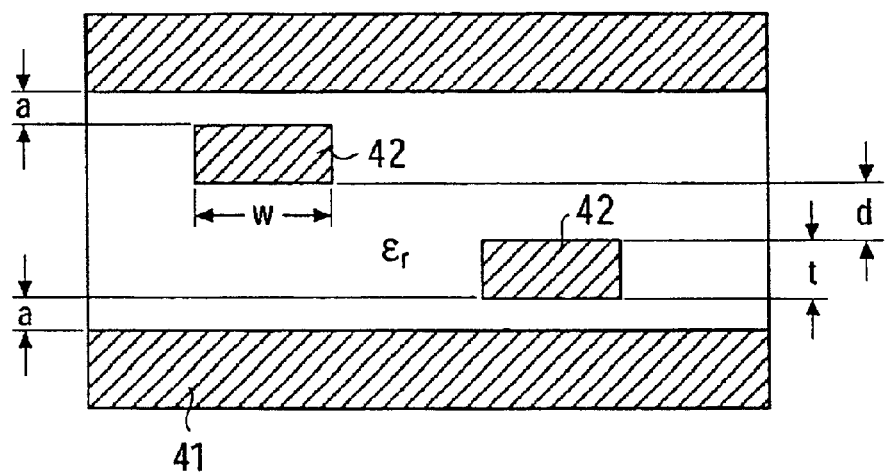
FIG. 4 is a diagram of still another wiring configuration to be checked by the printed circuit board wiring configuration check system embodying the invention.

FIGS. 2 through 4 are wiring configuration diagrams indicating wiring configurations subject to examination by the printed circuit board wiring configuration check system according to one embodiment of the present invention.

FIG. 2 shows a wiring configuration referred to as a micro strip line, FIG. 3 shows another configuration referred to as a single strip line, and FIG. 4 shows still another one referred to as a double strip line.

The wiring configuration shown in FIG. 2 has a power supply plane layer 21 and a wiring 22 provided over the power supply plane layer 21. The wiring configuration shown in FIG. 3 has power supply plane layers 31 and a wiring 32 sandwiched between the power supply plane layers 31. The wiring configuration shown in FIG. 4 has power supply plane layers 41, and two systems of wiring 42 sandwiched between the power supply plane layers 41. Here, the plane layer means that a conducting area of the plane layer is large enough compare to a conducting area of the corresponding wiring.

Although FIG. 2 shows a general wiring configuration on a printed circuit board, the high-speed signal line indicated in FIG. 1 is to be included in a category of the wiring defined in FIG. 2.

Further, in the wiring configurations shown in FIGS. 2 through 4, a length marked with symbol "w" denotes a width of wiring ($\mu$m); a length marked with symbol "t" denotes a thickness of wiring ($\mu$m); a length marked with symbol "h" denotes an interlayer distance ($\mu$m) between the wiring and the plane layer in the micro strip line configuration; a length marked with symbol "b" denotes a distance ($\mu$m) between two plane layers in the single strip line configuration; a length marked with symbol "a" denotes a distance ($\mu$m) between its wiring and a plane layer which is nearest to the wiring in a vertical direction in the single strip line or double strip line configurations; a length marked with symbol "d" denotes a distance ($\mu$m) between the two systems of wiring in the double strip line configuration; a symbol "$\in_r$" denotes a dielectric constant between the power supply plane layers 31 in the single strip line configuration, or a dielectric constant between the power supply plane layers 41 in the double strip line configuration; a symbol "$\in_{reff}$" denotes an effective dielectric constant between the power supply plane layer 21 and the high speed signal line 22 in the micro strip line configuration; and a symbol "dist" denotes a perpendicular distance (mm) between the high speed signal line and the edge line of the power supply layer.

Now, a function of the printed circuit board wiring configuration check system according to the present embodiment according to the present invention will now be described in the following.

The printed circuit board wiring configuration check system according to the present embodiment may be realized, for example, by a computer system including a CPU, a memory, and user interface units such as a keyboard and a display apparatus.

According to the printed circuit board wiring configuration check system of the present embodiment, the radiation noise generated from the high speed signal line may be suppressed significantly in its design stage advantageously without need of changing a conventional design process and without increasing its design cost. The printed circuit board wiring configuration check system comprises the steps of: measuring a perpendicular distance of a high speed signal line which is tentatively designed and laid out on a ground (power supply) plane and which is an object of check, relative to a layer edge of the plane or of a power supply plane which is nearest to the high speed signal line; computing a minimum distance required between the high speed signal line and the layer edge of the plane using equations (1) through (6); verifying whether the perpendicular distance measured above is shorter or not than the minimum distance required therebetween computed as above, namely examining whether or not the high speed signal line is disposed too near to the layer edge of the ground plane or of the power supply plane; and if the distance actually measured is shorter than the minimum distance required therebetween, displaying an error message including an instruction to move the high speed signal line toward the center portion of the board so as to be able to secure the minimum necessary distance computed above.

Figure 5:
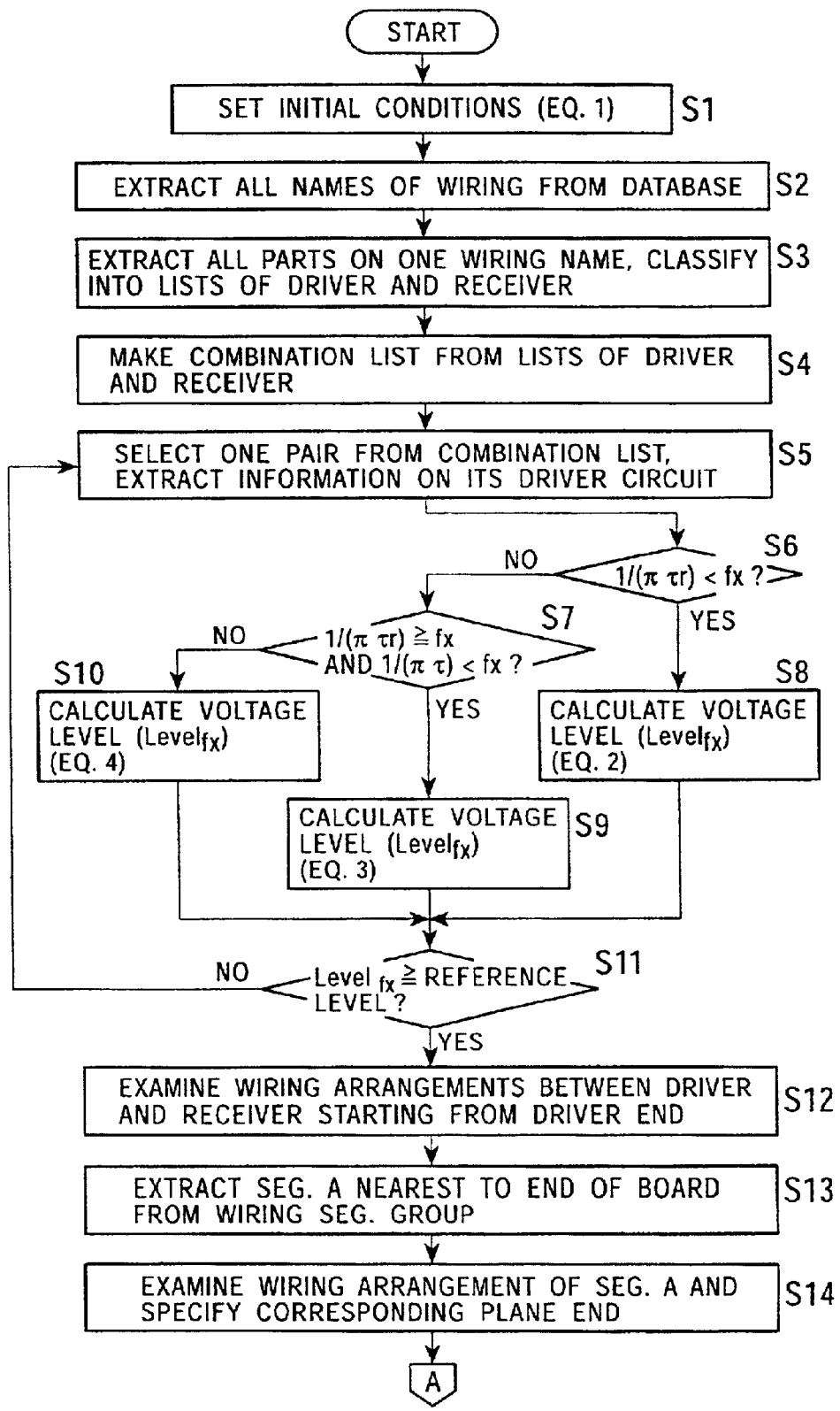
FIG. 5 is a flowchart (a former half portion) indicating operational steps of the wiring configuration check system of the invention for supporting a design task of a printed circuit board wiring lay-out.
Figure 6:
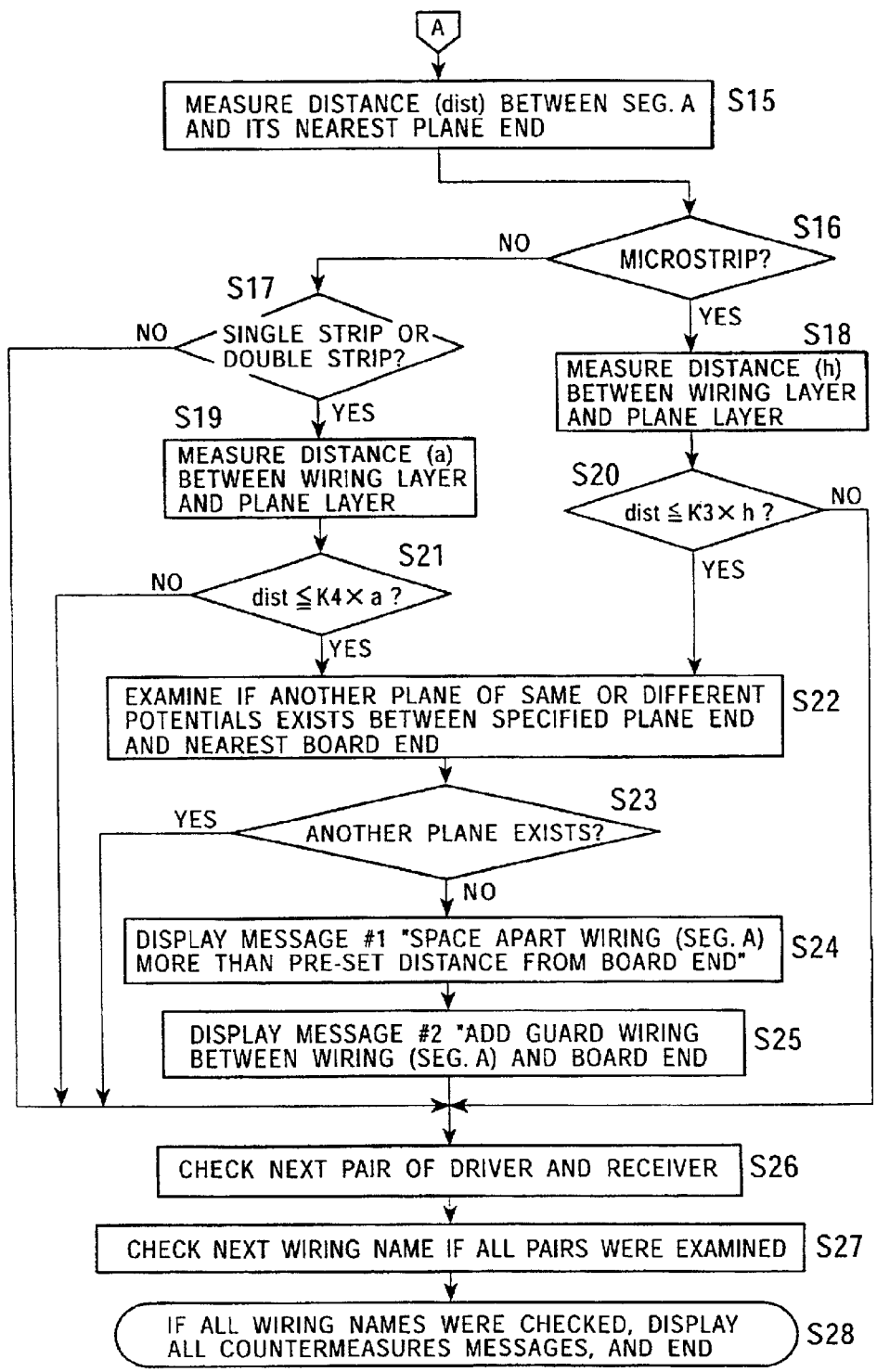
FIG. 6 is a flowchart (the latter half) indicating operational steps of the wiring configuration check system of the invention for supporting a design task of a printed circuit board wiring lay-out.

FIGS. 5 to 6 show a flowchart indicating operational steps of a wiring configuration check system employing a printed circuit board wiring design support method in accordance with one embodiment of the present invention.

With reference to the flowchart of FIGS. 5 and 6, and also referring to FIGS. 1 through 4, the operational steps of the system will now be described in the following.

In the following description, a symbol "$\tau$" denotes a pulse width (sec) of a current flowing through the high speed signal line between the driver and the receiver, a symbol "$\tau r$" denotes a rise time (sec) of this pulse, a symbol "fx" denotes a maximum applicable frequency (MHz) of the current flowing through the signal line, and "$Level_{fx}$" denotes a voltage level at the maximum applicable frequency fx of the current flowing through the signal line.

Further, symbols K1 through K4 are predetermined constants, and in particular, the symbol K1 is a predetermined maximum applicable frequency (MHz) of a current flowing through the signal line, while the symbol K2 is a predetermined reference level for a voltage level at the maximum applicable frequency fx.

As for the flowchart shown in FIGS. 5 and 6, and equations (1) through (7) to be used in the following description. The equations will be described together in the latter part of the description.

First, in step S1, an initial condition necessary for starting this check system is set up by substituting equation (1).

In step S2, all names of wiring are extracted from a circuit board database (not shown) which stores information relating to the circuit board.

In step S3, all parts existing along one specified name of wiring are extracted, and they are grouped into a list of drivers and a list of receivers.

In step S4, a combination list combining a driver and a receiver selected from the driver list and the receiver list is compiled.

In step S5, a pair of a driver and a receiver is selected from the combination list compiled above, and a circuit information of the driver of the pair is extracted.

In step S6, a conditional expression "$1/(\pi \tau r) < fx$" is determined if it holds, and if this conditional expression is satisfied, the process moves to step S8 in which "$Level_{fx}$" is computed using equation (2) which is to be described later, and if not, the process goes to step S7.

In step S7, conditional expressions "$1/(\pi \tau r) \geq fx$ and $1/(\pi \tau) < fx$" are determined whether or not they hold. If they are satisfied, in step S9, "$Level_{fx}$" is computed using a mathematical expression (3) which is to be described later, and if not, in step S10, "$Level_{fx}$" is computed using a mathematical expression (4) which will be described later, then the process moves to step S11.

In step S11, if a reference level of a current flowing through the high speed signal line between the pair of the driver and the receiver is defined to be K2, a conditional expression which contains constant K2, namely, expression (5) of "$Level_{fx} \geq K2$" is determined. If this conditional expression is not satisfied, the step returns to step S5, and if satisfied, the step moves to the following step S12.

In step S12, a preparation is made to investigate a wiring configuration laid out between the pair of the driver and the receiver one by one sequentially starting from the side of the driver to the side of the receiver via a series of the following steps.

In step S13, from a group comprising a plurality of minimum configuration units (segments) of wiring, a segment A which is nearest to the edge of the board is extracted.

In step S14, a wiring configuration of the segment A is investigated to specify an edge of the plane nearest thereto. The following description will be made referring to FIG. 6.

In step S15, a distance from the segment A to the edge of the plane specified to be the nearest thereto is determined.

In step S16, it is determined whether its wiring configuration with respect to the segment A is a micro strip line or not, and if it is not the micro strip line, the step advances to step S17, and if it is, the step moves to step S18.

In step S17, it is determined if its wiring configuration with respect to the segment A is a single strip line or a double strip line, and if it is not the single strip line nor the double strip line, the process moves to step S26 which will be described later, and if it is the single strip line or the double strip line, the process moves to step S19 which will be described later.

In step S18, a distance "h" between the wiring layer and the plane layer is determined, then the process moves to step S20 to be described later.

In step S19, a distance "a" between the wiring layer and the plane layer is determined, then the process moves to step S21 to be described later.

In step S20, a mathematical expression (6) is evaluated, namely, it is determined if the perpendicular distance denoted by the symbol "dist" exceeds a value of "K3 (constant)×h" or not, and if it does, the step moves to step S26 to be described later, and if it does not, the step moves to step S22 to be described later.

In step S21, a mathematical expression of (7) is evaluated, namely, it is determined if the perpendicular distance denoted by the symbol "dist" exceeds a value of "K4 (constant)×a" or not, and if it does, the process moves to step S26, if not, the process advances to step S22.

In step S22, it is examined if there exists another plane at same/different potentials between the edge of the plane specified above and the edge of a plane which is nearest thereto in a vertical direction.

In step S23, if there exists another plane therebetween, the step of control shifts to step S26 which is to be described later, and if not, the process advances to step S24.

In step S24, a countermeasure instruction message #1 corresponding to the above-mentioned name of the wiring is output for display. Contents of the countermeasure instruction message #1 may include such a message as "space apart the wiring (segment A) from the edge of the plane by a specified distance (for example, 20a and 20h) or more."

Subsequently, in step S25, another countermeasure instruction message #2 corresponding to the above-mentioned name of the wiring is output for display. Contents of the another countermeasure instruction message #2 may include such a message as "add a guard wiring between the wiring (segment A) and the edge of the board."

In step S26, a next pair of a driver and a receiver in the combination list in the group under the same name of the wiring is checked.

In step S27, when all combinations of the drivers and the receivers in the combination list in the same wiring name have been checked, a next name of the wiring will be checked.

In step S28, when all names of the wiring and their combinations of the drivers and the receivers have been checked, all of the aforementioned countermeasure instructions messages, namely, the messages #1 and #2 described above are displayed, then the process flow ends.

Figure 7:
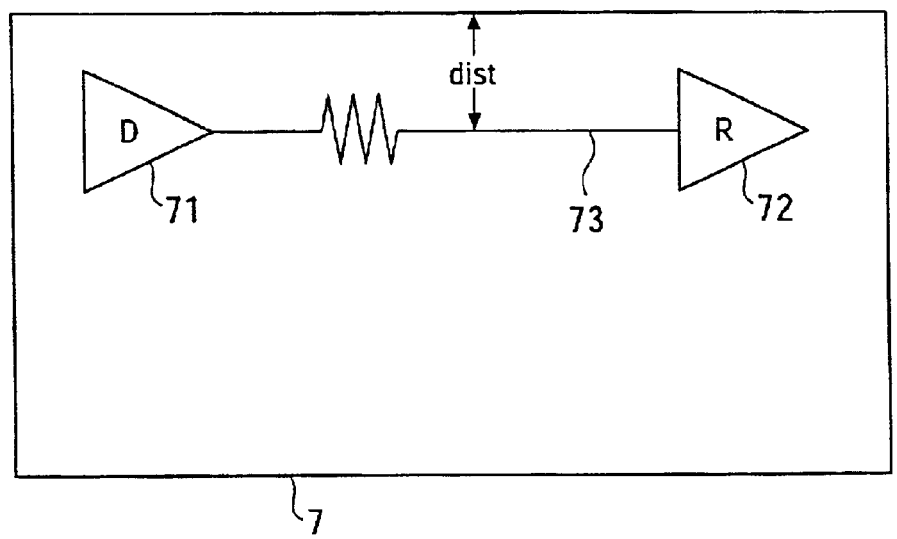
FIG. 7 is a schematic diagram showing an example of wiring layouts on a wiring board to be checked by the printed circuit board wiring configuration check system embodying the invention.

Now, with reference to FIG. 7, an example of wiring configurations laid out on a printed circuit board subject to examination by the printed circuit board wiring configuration check system in accordance with one embodiment of the present invention is illustrated.

The wiring on the circuit board (on-board wiring) comprises a power supply plane 7, a driver 71 and a receiver 72 provided on the power supply plane 7, and a high speed signal line 73 connecting between the driver 71 and the receiver 72.

A design specification of the aforementioned on-board wiring may be defined as follows, for example.

Namely, its signal wiring (line) name is defined to be E1; a total length of the wiring to be 100.0 mm; its driver (D) to be IC100, 1 pin; its receiver (R) to be IC200, 1 pin; its operational frequency to be 50.0 MHz; its pulse width (τ) to be 10.0 ns; its rise time (τr) to be 1.0 ns; its amplitude (A) to be 3.3 V; and its perpendicular distance "dist" between the wiring and the plane edge to be 0.16 mm, respectively.

Figure 8:
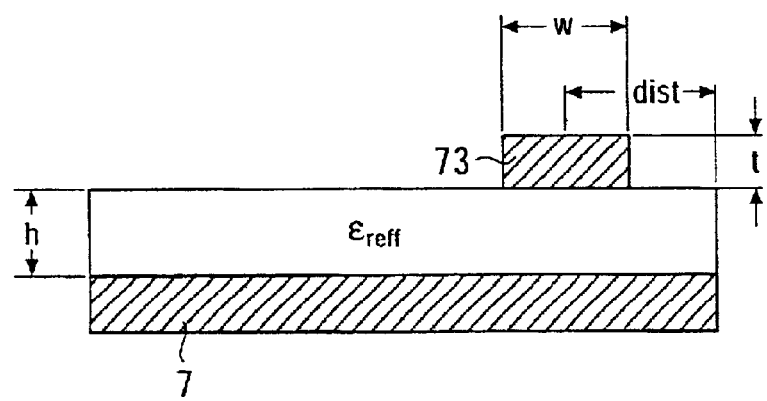
FIG. 8 is a schematic diagram showing an example of wiring configurations in a wiring board to be checked by the printed circuit board wiring configuration check system embodying the invention.

FIG. 8 is a diagram indicating an example of wiring configurations laid out on a wiring board which is an object of examination by the printed circuit board wiring configuration check system of the present invention.

A design specification of the wiring configuration on the wiring board shown in FIG. 8 may be defined to be as follows, for example.

Namely, a type of its wiring configuration is a micro strip line, wherein a width of its wiring "W" is defined to be 0.16 mm=160 $\mu$m; a thickness of wiring "t" to be 0.04 mm=40 $\mu$m; a height of wiring "h" to be 0.10 mm=100 $\mu$m; an effective dielectric constant "$\in_{reff}$" to be 4.3; and a perpendicular distance "dist" between the wiring and the edge line of the plane to be 0.16 mm.

Figure 9:
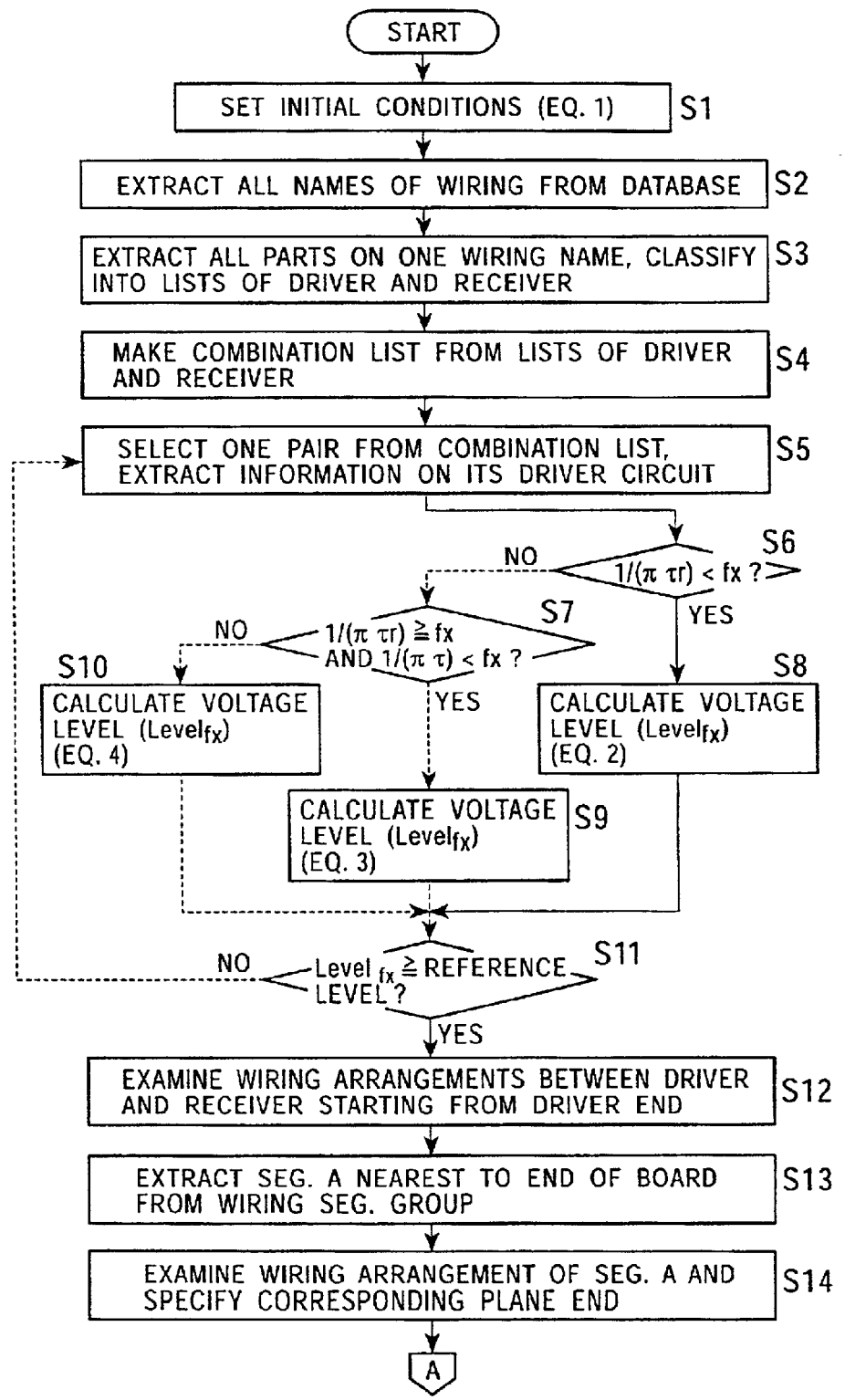
FIG. 9 is a flowchart (the former half portion) indicating process steps when the printed circuit board wiring configuration check system of the invention was executed for a design of a printed circuit board having the board wiring shown in FIG. 6 and the wiring configuration shown in FIG. 7.
Figure 10:
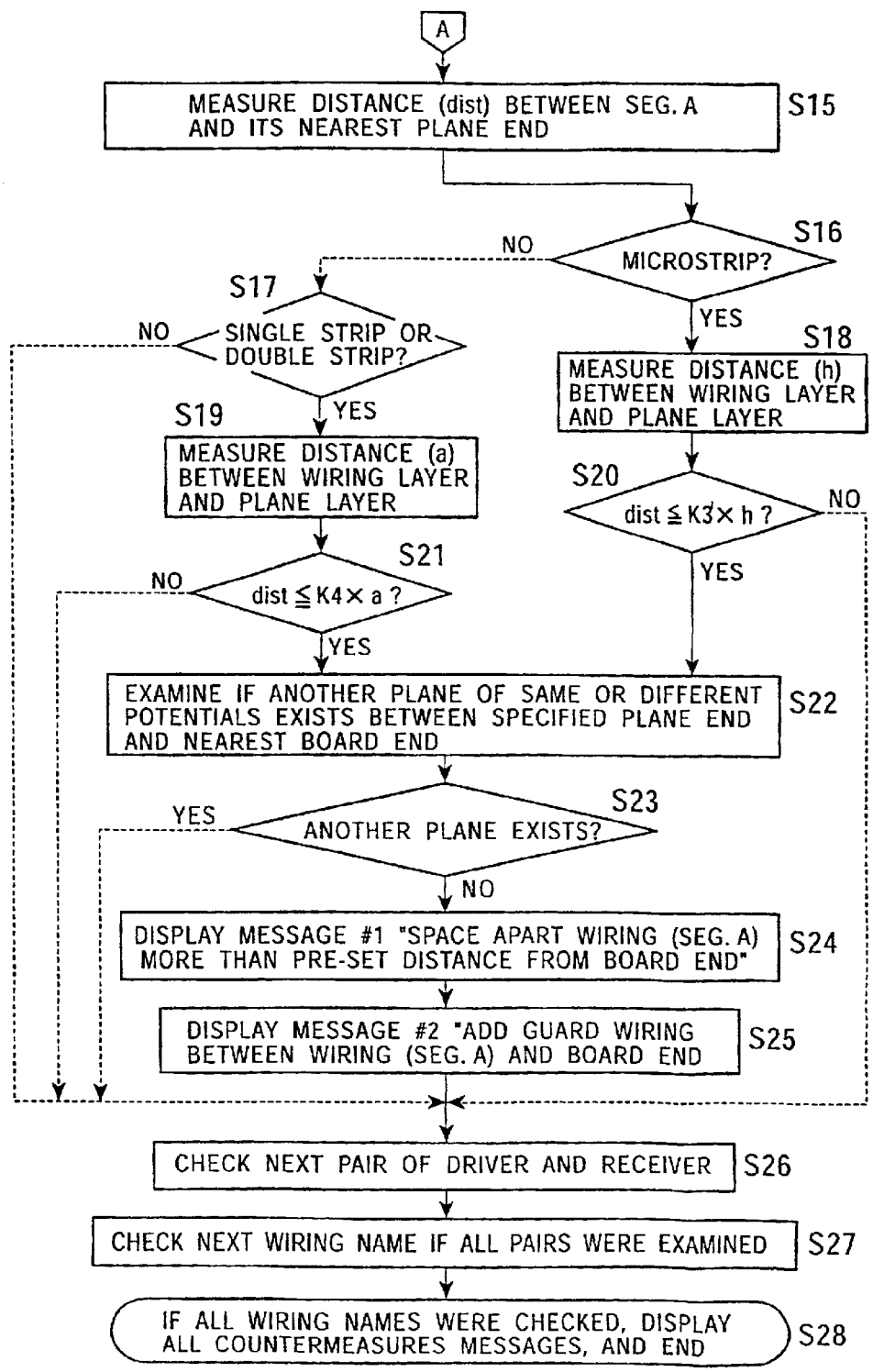
FIG. 10 is a flowchart (the latter half) indicating process steps when the printed circuit board wiring configuration check system of the invention was executed for a design of a printed circuit board having the board wiring shown in FIG. 6 and the wiring configuration shown in FIG. 7.

FIGS. 9 and 10 are flowcharts indicating process steps executed when the printed circuit board wiring configuration check system is applied to examination of a printed circuit board comprising the circuit board wiring indicated in FIG. 7 and the wiring configuration indicated in FIG. 8.

In the flowcharts indicated in FIGS. 9 and 10, a solid line indicates a path of process steps actually executed in the instant example, and a broken line indicates a path of process steps not executed in the above-mentioned process operation in the instant example.

Here, in the instant example, it is shown that the process steps including S1 through S6, S8, S11 through S16, S18, S20 and S22 through S28 are executed, and the other process steps are not executed.

The above-mentioned process steps will be described sequentially following respective steps actually executed in the instant example.

It is defined here that the constant K1=1200, i.e., a given maximum applicable frequency fx=1200 MHz; the constant K2=72.0, i.e., a given reference level to be 72.0 dB$\mu$V; and the constants K3 and K4 to be 20, respectively.

First, in step S1, it is set as an initial condition that its maximum applicable frequency fx=1200 MHz, and that its reference level=72.0 dB$\mu$V.

In step S2, the wiring name "E1" of the board wiring indicated in FIGS. 7 and 8 is extracted from the database storing data regarding on the circuit board to be checked.

In steps S3 and S4, a combination list (IC100, IC200) is compiled from the list of drivers (IC100) and the list of receivers (IC200).

In steps S5, S6 and S8, circuit variables denoted by symbols "τ", "τr" are extracted from the circuit information on the aforementioned driver, then "Level$_{fx}$=87.3 dB$\mu$V" is computed using equation (2).

In step S11, the above-mentioned Level$_{fx}$=87.3 dB$\mu$V is compared with the above-mentioned reference level, i.e., 72.0 dB$\mu$V.

In steps S12 through S14, as a result of the investigation of the wiring configuration of the board wiring under the wiring name of E1, an existence of the segment A which is the nearest to the board edge is confirmed, and the edge of its plane is specified.

With reference to FIG. 10, in step S15, the perpendicular distance "dist" between the segment A and its nearest plane edge is determined, for example, to be 0.16 mm.

In steps S16 and S18, it is determined if its wiring configuration of the segment A is a micro strip line or not, then its arrangement, i.e., its vertical distance "h" between the wiring layer and the plane layer is determined, for example, to be 0.10 mm.

In step S20, the perpendicular distance "dist=0.16 mm" of the plane edge nearest to the segment A and the value of the constant "K3" times the distance "h" measured above ("K3× h=2.0 mm") are compared, then depending on its result, the process advances to step S22.

In steps S22 and S23, it is verified that no other plane exists between the edge of the plane layer specified above and an edge of its nearest board layer.

In step S24, the countermeasure instruction message #1 corresponding to the above-mentioned wiring name E1 is output for display.

In step S25, another countermeasure instruction message #2 corresponding likewise to the wiring name E1 is output for display.

In steps S26 through S28, it is verified that no other wiring name exists, and that the aforementioned countermeasure instruction messages #1 and #2 are displayed, then the flow of check ends.

A result of measurements of magnetic fields carried out for two instances of the perpendicular distance "dist" between the high speed signal line and the ground plane edge when it was 0.16 mm and when it was 12.5 mm will be described in the following.

A near magnetic field measurements was carried out over a surface to be checked using a magnetic field probe (a loop antenna) and inputting 0 dBm from a tracking generator in a frequency range from 100 MHz to 1 GHz. A region 7 m above the circuit board surface was measured in X-axis (transverse) direction and Y-axis (longitudinal) direction. As a result, the following fact was confirmed that in both cases of the perpendicular distances from the ground plane edge of 0.16 mm and 12.5 mm, their magnetic levels have dropped significantly in a wide region by 12 dB at maximum.

Accordingly, it is proved that the printed circuit board wiring configuration check system in accordance with the present invention enables to support a very efficient on-board wiring design capable of significantly suppressing a spurious electromagnetic radiation noise from the printed circuit board.

(Description of Mathematical Expressions)

The mathematical expressions referred to in the foregoing description will now be described in the following.

In the following description, however, although a symbol A denotes an amplitude (V) of a pulse current flowing through the high-speed signal line, the other symbols refer to the same as already described.

In the following, the mathematical expressions referred to in the description of the process steps in the above-mentioned flowcharts will now be described.

Relating to step S1, there is an equation (1) as follows.

$$fx = K1 \qquad (1)$$

Then, relating to steps S6 and S8 in the flowchart shown in FIGS. 5 and 9, there is a conditional expression (2) as follows.

IF $1/(\pi \times \tau r) < fx$ THEN $$\text{Level}_{fx} = 120 + 20 \log 10(A \times \tau r / \tau) - 40 \log 10(fx \times \pi \times \tau r) \qquad (2)$$

Further, regarding steps S7 and S9 in the flowchart shown in FIGS. 5 and 9, there is a conditional expression (3) as follows.

IF $1/(\pi \times \tau r) \geq fx$ AND $1/(\pi \times \tau) < fx$ THEN $$\text{Level}_{fx} = 120 + 20 \log 10(A/[fx \times \pi \times \tau]) \qquad (3)$$

Still further, regarding the steps S7 and S10 in the flowchart of FIGS. 5 and 9, there is a conditional expression (4) as follows.

IF $1/(\pi \times \tau r) \geq fx$ THEN $$\text{Level}_{fx} = 120 + 20 \log 10A \qquad (4)$$

In the next, regarding step S11 in the flowchart shown in FIGS. 5 and 9, there is a determination equation (5) as follows.

$$\text{Level}_{fx} \geq K2 \qquad (5)$$

Then, regarding step S20 in the flowchart shown in FIGS. 6 and 10, there is a determination equation (6) as follows.

$$\text{dist} \leq K3 \times h \qquad (6)$$

Finally, regarding step S21 in the flowchart shown in FIGS. 6 and 10, there is another determination equation (7) as follows.

$$\text{dist} \leq K4 \times a \qquad (7)$$

By way of example, a computer program for executing the process steps such as in the flowchart of FIGS. 5 and 6 according to the printed circuit board wiring configuration check system in accordance with the present embodiment may be provided in a computer readable memory medium such as a CD-ROM, magnetic tape or the like. Then, a computer including in its category at least a microcomputer, a personal computer and a general-purpose computer may be used to read out such a computer program from the memory medium to execute the same.

According to the features of the present invention as described hereinabove, because of the provision of the means for computing the minimum required distance (perpendicular/vertical distances) between the position of the high speed signal line which was tentatively laid out on the power supply plane and the ground-plane edge or the power supply plane edge, and so on, then comparing the same with the measured distance, and if the position of the high speed signal line thereon is determined not suitable, an appropriate instruction corresponding to the signal line under the specified name is displayed, thereby ensuring an efficient and effective design support task for supporting the wiring lay-out design on the printed circuit board to be accomplished.

Having described our invention as related to the embodiments shown in the accompanying drawings, it is our intention that the present invention be not limited by any of the details of description, unless otherwise specified, but rather be construed broadly within its spirit and scope as set out in the accompanying claims.

What is claimed is:

1. A printed circuit board wiring configuration analysis system for analyzing a wiring configuration, comprising:

an object determination unit for determining if there exists a high speed signal wiring, said determination being made after identifying a pair of a driver and a receiver;

a wiring segment identifying unit for identifying a wiring segment that is nearest to said board edge from a group of segments;

a plane edge identifying unit for identifying a plane edge that is nearest, in a perpendicular direction, to a wiring between the driver and the receiver of said segment;

a unit for determining a perpendicular distance between the wiring segment extending from the driver to the receiver and said plane edge;

a unit for computing a minimum interlayer distance required between a wiring layer of said segment and a layer of said plane;

a distance determination unit for comparing said perpendicular distance determined and said interlayer distance computed; and thereafter, automatically identifying any segments that are not desirable.

2. A printed circuit board wiring configuration check system as claimed in claim 1, further comprising:

a unit for identifying a voltage level of a pulse signal flowing through said wiring segment; and a unit for identifying a high speed signal wiring when said voltage level is not lower than a reference voltage.

3. A printed circuit board wiring configuration analysis system as claimed in claim 2, wherein said unit for identifying the voltage level of the pulse signal determines a voltage level thereof on the basis of an equation which contains, as its variable, a maximum applicable frequency, a rise time, a pulse width and an amplitude.

4. A printed circuit board wiring configuration analysis system as claimed in claim 1, wherein said wiring configuration is classified, as its type, a micro strip line, a single strip line, or a double strip line.

5. A printed circuit board wiring configuration analysis system as claimed in claim 1, further comprising a display unit for displaying a message in accordance with a result of the analysis.

6. A method for analyzing a wiring configuration, comprising the steps of:

determining if there is a high speed signal wiring, said determination being executed after identifying a pair of a driver and a receiver;

identifying a segment that is part of said high speed signal wiring and which is nearest to a board edge from a group of segments;

identifying a plane layer edge that is nearest, in a perpendicular direction, to a wiring between a driver and a receiver;

determining a perpendicular distance between the wiring extending from the driver to the receiver of said segment and said plane layer edge;

computing a minimum interlayer distance required between a wiring layer of said segment extracted and said plane layer;

comparing said perpendicular distance determined and said interlayer distance computed; and displaying a message that contains a predetermined instruction corresponding to said wiring in accordance with a result of said comparison.

7. A computer program for analyzing a wiring configuration which is designed on a printed circuit board, comprising the steps of:

determining if there is a high speed signal wiring, said determination being made after identifying a pair of a driver and a receiver from a group of components;

identifying a segment that includes said high speed signal wiring and is nearest to said board edge from a group of segments;

identifying a plane layer edge that is nearest, in a perpendicular direction, to a wiring between the driver and receiver;

determining a perpendicular distance between the wiring and said plane layer edge;

computing a minimum interlayer distance required between a wiring layer of said segment and said plane layer;

comparing said perpendicular distance and said interlayer distance computed; and identifying any undesirable aspects of said wiring.

8. A computer readable medium containing the computer program claimed in claim 7.

* * * * *